(12) United States Patent
Wu et al.

(10) Patent No.: US 11,196,388 B2
(45) Date of Patent: Dec. 7, 2021

(54) CONSTANT GAIN AND SELF-CALIBRATION TECHNIQUE FOR RF AMPLIFIER

(71) Applicant: Tubis Technology Inc., Pasadena, CA (US)

(72) Inventors: Kenny Wu, Pasadena, CA (US); Yuhmin Lin, Pasadena, CA (US); James Wang, Pasadena, CA (US)

(73) Assignee: TubisTechnology INC., San Diego, CA (US)

( * ) Notice: Subject to any disclaimer, the term of this patent is extended or adjusted under 35 U.S.C. 154(b) by 72 days.

(21) Appl. No.: 16/785,504

(22) Filed: Feb. 7, 2020

(65) Prior Publication Data

US 2020/0259462 A1 Aug. 13, 2020

Related U.S. Application Data

(60) Provisional application No. 62/802,344, filed on Feb. 7, 2019.

(51) Int. Cl.
*H03F 3/04* (2006.01)
*H03F 1/30* (2006.01)
(Continued)

(52) U.S. Cl.
CPC ............... *H03F 1/30* (2013.01); *H03F 1/56* (2013.01); *H03F 3/45076* (2013.01);
(Continued)

(58) Field of Classification Search
CPC .......... H03F 3/04; H03F 3/45; H03F 2200/24; G05F 1/10
(Continued)

(56) References Cited

U.S. PATENT DOCUMENTS 6,175,278 B1 * 1/2001 Hasegawa ............ H03G 1/0088
330/278
9,473,122 B1 10/2016 Shen et al.
(Continued)

FOREIGN PATENT DOCUMENTS

KR 1020110040589 A 10/2009
WO WO2015138105 A1 3/2014

OTHER PUBLICATIONS

International Search Report and Written Opinion of International Search Authority for PCT/US2020/017362 dated Jun. 9, 2020 (15 pages).

*Primary Examiner* — Steven J Mottola
(74) *Attorney, Agent, or Firm* — Imperium Patent Works; Zheng Jin

(57) ABSTRACT

Radio Frequency (RF) amplifier design with RFIC suffers gain variations from gain variations due to wafer process variations, temperature changes, and supply voltage changes. Three methods are proposed to achieve constant amplifier gain, either through on-chip wafer calibration, or self-calibration. Through automatic adjustment of amplifier bias current, the proposed methods maintain constant amplifier gain over process, temperature, supply voltage variations. Under the proposed Method 1, a constant transconductance Gm with enhanced gain accuracy is maintained via wafer calibration. Under the proposed Method 2, a constant transconductance Gm is maintained by time-domain averaging through different transistors. Under the proposed Method 3, a constant Gm*R or RF gain is maintained considering the impedance of a matching network of the RF amplifier.

20 Claims, 7 Drawing Sheets

(51) Int. Cl.
  *H03F 3/45*   (2006.01)
  *H03F 1/56*   (2006.01)
  *H04B 7/06*   (2006.01)

(52) U.S. Cl.
  CPC .. *H03F 2200/387* (2013.01); *H03F 2200/447* (2013.01); *H03F 2200/451* (2013.01); *H03F 2203/45116* (2013.01); *H04B 7/0617* (2013.01)

(58) Field of Classification Search
  USPC ............. 330/2, 261, 285, 296; 327/534, 535
  See application file for complete search history.

(56) References Cited

U.S. PATENT DOCUMENTS

| | | | |
|---|---|---|---|
| 2005/0062524 A1 | 3/2005 | Kato et al. | 327/561 |
| 2010/0066437 A1 | 3/2010 | Siprak et al. | 327/534 |
| 2011/0210795 A1* | 9/2011 | Ohta | H03F 3/195 |
| | | | 330/288 |
| 2015/0263671 A1 | 9/2015 | Nguyen et al. | 455/73 |

\* cited by examiner

CONSTANT GAIN AND SELF-CALIBRATION TECHNIQUE FOR RF AMPLIFIER

CROSS REFERENCE TO RELATED APPLICATIONS

This application claims priority under 35 U.S.C. § 119 from U.S. Provisional Application No. 62/802,344, entitled "Constant Gain and Self-Calibration Technique for RF Amplifier," filed on Feb. 7, 2019, the subject matter of which is incorporated herein by reference.

TECHNICAL FIELD

The disclosed embodiments relate generally to wireless network communications, and, more particularly, to radio frequency (RF) amplifier with precision amplifier gain in phased array antenna.

BACKGROUND

In antenna theory, a phased antenna array usually means an array of antennas that creates a beam of radio waves can be electronically steered to point in different directions, without moving the antennas. Beamforming is technique by which an array of antennas can be steered to transmit radio signals in a specific direction. The phase and amplitude of each signal is added constructively and distructively in such a way that they concentrate the energy into a narrow beam or lobe. Sidelobes are the far field radiation pattern of an antenna that are not the main lobe. For multiple array antennas operate in a high-density area, each array antenna has its own beam to point to specific user (direction). The emission via antenna sidelobe of one antenna causes interference to users receiving signal from adjacent antennas. For multiple beam array antenna, each antenna beam points to specific direction. The emission via antenna sidelobe of one antenna beam causes interference to users receiving signal from adjacent antenna beams.

In a typically phased-array antenna configuration, multiple radio frequency integrated circuits (RFICs), e.g., beamforming RFICs, are used. Each signal path for antenna element contains variable gain amplifiers and phase shifters. Signals from each antenna element are amplified and phase shifted by different amount (amplitude and phase tapering) to control antenna sidelobe. For example, Chebyshev or Taylor tapering is commonly used for lower antenna sidelobe. It is thus important to calibrate amplifier gain (to provide consistent gain) in the RFICs to achieve accurate amplitude tapering. Typical precision needs for amplitude tapering is 0.375 dB or lower and for phase shifter is 6- or 7-bit precision to achieve the low sidelobe. Note that in an active phase shifter design (such as quadrature modulator), the phase precision is achieved via precision amplitude gain control in the in-phase amplifier and the quadrature-phase amplifier.

The bandwidth shortage increasingly experienced by mobile carriers has motivated the exploration of the under-utilized Millimeter Wave (mmWave) frequency spectrum around 24G and 300G Hz for the next generation 5G broadband cellular communication networks. To support directional communications with narrow beams in mmWave networks, a 5G base station typically supports multiple beam with phased-array antennas. Sidelobes of one beam interferes with the main beam of another beam. It is desirable to control the peak sidelobe level to <-40 dB to <-45 dB to achieve the signal-to-interference ratio requirement for the high order modulation signal such as 256 QAM to allow the full bandwidth to be used in each of the multiple beams. Without amplitude and phase tapering (uniform illumination), the peak antenna sidelobe is limited to -13 dB below main lobe.

RF amplifiers within RFIC are subject to 1) PVT variation (variations in the wafer process, supply voltage, and temperature)—typically results in several dBs of variations if uncompensated; and 2) random variations due to transistor or passive element size variations—this requirement is usually met by limiting the smallest size of transistor, capacitor, resistor to be used within the RFIC. In order to meet the high accuracy requirement (such as 0.375 dB) for amplitude tapering across the antenna array, it is necessary to calibrate RFICs and amplifiers across the antenna array. To reduce the production complexity and post production antenna calibration cost, it is desirable that RFIC is self-calibrated by design for different production and be able to track across different temperature ranges or calibrated during the production process by automatic test equipment.

A calibration method for RF amplifiers requiring precision RF amplifier gain is sought.

SUMMARY

Radio Frequency (RF) amplifier design with RFIC, e.g., implemented in CMOS, CaAs, SiGe, or other silicon processes, suffers gain variations from gain variations due to wafer process variations, temperature changes, and supply voltage changes, and random variations. Four methods are proposed to achieve constant amplifier gain, either through on-chip wafer calibration, or self-calibration. Through automatic adjustment of amplifier bias current, the proposed methods maintain constant amplifier gain over process, temperature, supply voltage variations. Under the proposed Method 1, a constant transconductance Gm with enhanced gain accuracy is maintained via wafer calibration. Under the proposed Method 2, a constant transconductance Gm is maintained by time-domain averaging through different transistors. Under the proposed Method 3, a constant Gm*R or RF gain is maintained considering the impedance of a matching network of the RF amplifier. Under the proposed Method 4, the transistor is first calibrated (selected) using, e.g., Method 1 to reduce the tolerance and then Method 3 is applied.

Other embodiments and advantages are described in the detailed description below. This summary does not purport to define the invention. The invention is defined by the claims.

DETAILED DESCRIPTION

Reference will now be made in detail to some embodiments of the invention, examples of which are illustrated in the accompanying drawings.

Figure 1:
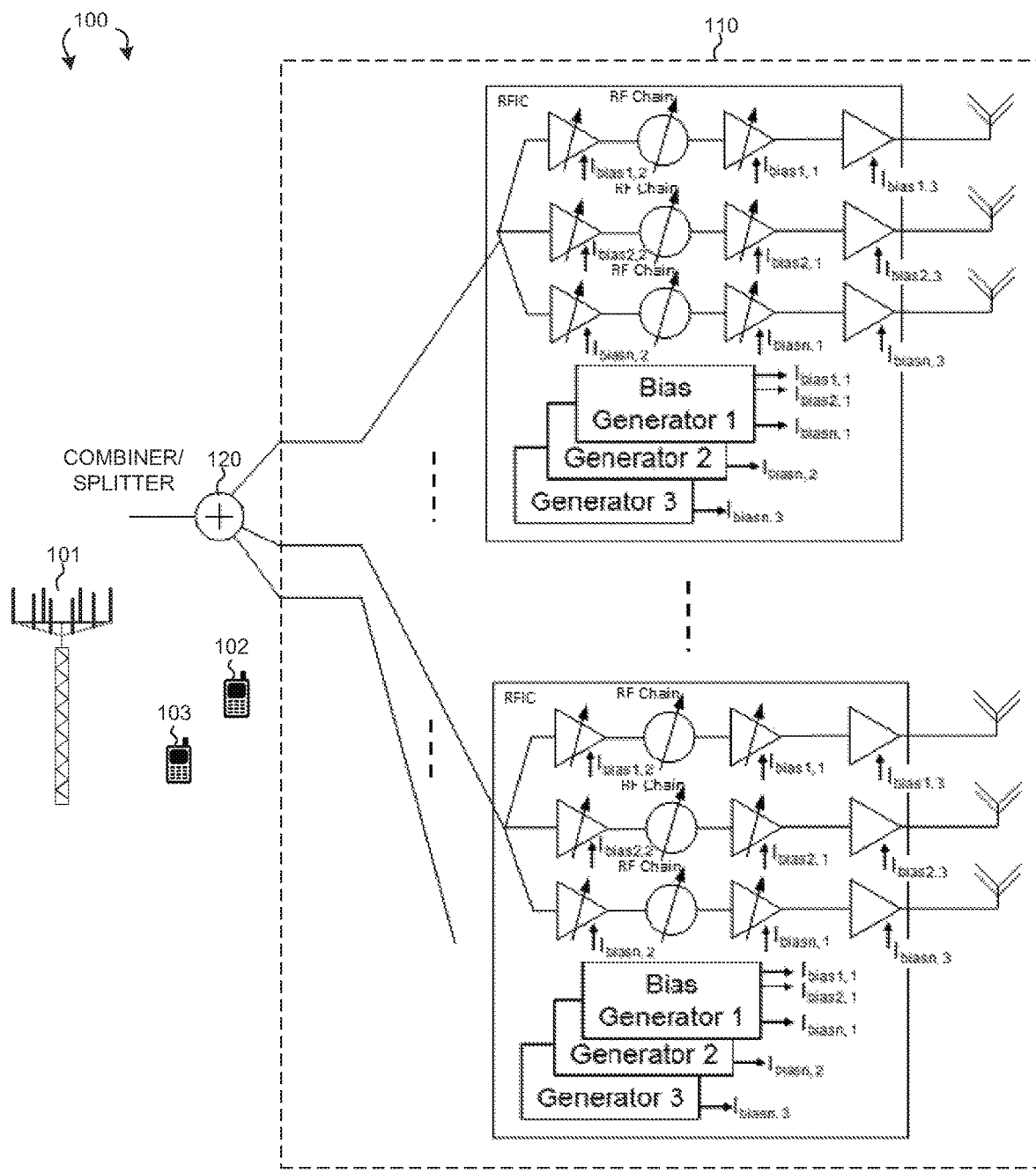
FIG. 1 is a simplified block diagram of a plurality of phased-array antennas using bias generators in accordance with one novel aspect.

FIG. 1 is a simplified block diagram of a plurality of phased-array antennas using bias generators in accordance with one novel aspect. Beamforming cellular mobile communication network 100 comprises a base station BS 101 and a plurality of user equipments including UE 102 and UE 103. The cellular mobile communication network uses directional communications with narrow beams and can support multi-gigabit data rate. One example of such cellular network is a Millimeter Wave (mmWave) network utilizing the mmWave frequency spectrum. In such mmWave network, directional communications are achieved via beamforming, wherein a phased antenna array having multiple antenna elements are applied with multiple sets of beamforming weights (phase shift values) to form multiple beam patterns, which are required to overcome high path loss in the mmWave network and to provide mobility support for UE 102 and UE 103.

In the example of FIG. 1, BS 101 comprises multiple phased-array antennas 110 coupled to a combiner splitter network 120. For multiple array antennas operate in a high-density area, each array antenna has its own beam to point to a specific UE (direction). The emission via antenna sidelobe of one antenna causes interference to UEs receiving signal from adjacent antennas. For multiple beam array antenna, each antenna beam points to a specific UE direction at a given time instant. The emission via antenna sidelobe of one antenna beam causes interference to UEs receiving signal from adjacent antenna beams which point to different UEs.

In a typical phased-array antenna configuration, multiple radio frequency integrated circuits (RFICs), e.g., beamforming RFICs, are used. Each signal path for antenna element contains variable gain amplifiers and phase shifters. Signals from each antenna element are amplified and phase-shifted by different amount (amplitude and phase tapering) to control antenna sidelobe. For example, Chebyshev or Taylor tapering is commonly used for lower antenna sidelobe. It is thus important to calibrate amplifier gain (to provide consistent gain) in the RFICs to achieve accurate amplitude tapering. Typical precision needs for amplitude tapering 0.375 dB or lower and for phase shifter is 6- or 7-bit precision to achieve low sidelobe.

RF amplifiers within RFIC are subject to 1) PVT variation (variations in the wafer process, supply voltage, and temperature)—typically results in several dBs of variations if uncompensated; and 2) random variations due to transistor or passive element size variations—this requirement is usually met by limiting the smallest size of transistor, capacitor, resistor to be used within the RFIC. In order to meet the high accuracy requirement (such as 0.375 dB) for amplitude tapering across the antenna array, it is necessary to calibrate RFICs and amplifiers across the antenna array. To reduce the production complexity and post production antenna calibration cost, it is desirable that RFIC is self-calibrated by design for different production and be able to track across different temperature ranges or calibrated during the production process by automatic test equipment.

In accordance with one novel aspect, constant transconductance (Gm) bias generators with self-calibration are used for maintaining the transconductance gain of the RF amplifiers across the RFICs in phased-array antennas. In the example of FIG. 1, multiple sets of constant Gm bias generators 1, 2, 3 . . . are used to provide bias currents for RFICs in phased-array antennas 110. Constant Gm bias circuits are widely used in many RF amplifier applications including instrumentation amplifier, power detector drive amplifier, and signal back-off control for power amplifier, etc. The constant Gm is converted to a fixed current by using a voltage provided by a bandgap reference. If the Gm and the reference voltage are PVT independent, then the fixed current generated using these parameters is also PVT independent and hence can be used as a master bias current for a large RFIC. Note that the transistor size in the bias generator should replicate the transistor size used in the RF amplifiers to maintain good tracking of Gm. As a result, multiple sets of constant Gm bias generators with different transistor sizes are needed for RF amplifiers having different transistor sizes across RFICs in phased-array antennas 110.

For each constant Gm bias generator, a precision and temperature-stable off-chip external resistor is used as a reference and a transistor size ratio K is used to obtain a precision Gm. Note that the size ratio K is critical for obtaining the precise value of Gm. In a first method, multiple transistors in the RFIC is included and (K+1) transistors with closely matched Gm are selected, and one is selected from the (K+1) transistors to provide the best matching ratio K. In a second method, a precision clock is used in the round robin to select one of the (K+1) transistors and an averaging circuit is used to average the current or voltage bias over (K+1) cycles. In a third method, considering the impedance of a matching network, it is more precise to control Gm*$R_{equivalent}$ or provide constant gain of the RF amplifiers.

Figure 2:
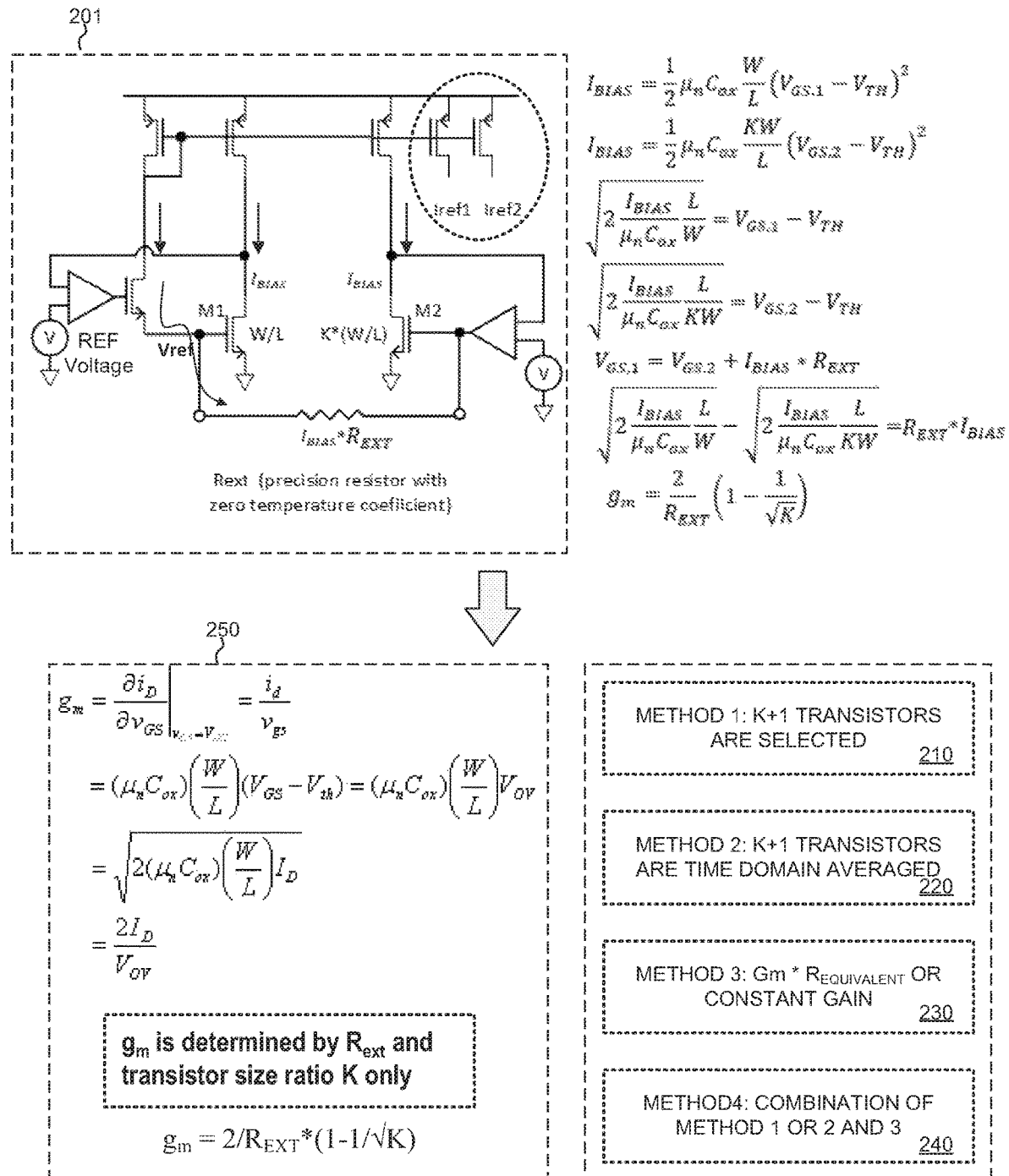
FIG. 2 is a simplified circuit diagram of a bias generator supporting constant gm bias to be used in radio frequency amplifiers in RFIC.

FIG. 2 is a simplified circuit diagram of a bias generator 201 supporting constant Gm bias to be used for RF amplifiers in RFIC. Bias generator 201 comprises a pair of transistors M1 and M2, the gate of M1 and M2 are coupled by an external resistor $R_{EXT}$. Transistor M1 has a size of W/L, and transistor M2 has a size of K*(W/L). As depicted by 250, the constant $G_m$ bias is determined by $R_{EXT}$ and the transistor size radio K only: $g_m = 2/R_{EXT}*(1-1/\sqrt{K})$, wherein $R_{EXT}$ is a precision resistor with zero temperature coefficient. Therefore, because the Gm and the reference voltage are PVT independent, then the fixed current generated using these parameters is also PVT independent and hence can be used as a master bias current for a large RFIC. In FIG. 2, Iref1 and Iref2 are different bias current mirrors to be used for different RF amplifiers.

Note that the size ratio K between transistor M1 and transistor M2 is critical for obtaining the precise value of Gm. Additionally, the transistor M1 should replicate the transistor used in the RF amplifiers to maintain good tracking of Gm. It is thus critical to use the same type of transistor and the size. As a result, transistor M2 is formed by replicating K identical transistors M1 having the same size of (W/L). Further, the current density of the transistors should be the same as the current density of the RF amplifier. Therefore, while increasing transistor size can improve the accuracy of the size ratio K, it is not desirable to have a large sized M1 and M2 transistors in order to achieve low power consumption and smaller size of the RFIC.

Based on the above considerations, four different methods are proposed to achieve constant Gm bias generators with self-calibration for maintaining the transconductance gain of the RF amplifiers across the RFICs in phased-array antennas. In a first method (210), multiple transistors in the RFIC is included and (K+1) transistors are selected with best matching radio K. In a second method (220), a precision clock is used to select in the round robin one of the (K+1) transistors and an averaging circuit is used to average the current or voltage bias over (K+1) cycles. In a third method (230), considering the impedance of a matching network, it is more precise to control $Gm*R_{equivalent}$ or provide constant gain of the RF amplifiers across the RFICs. In a fourth method (240), a combination of constant Gm calibration procedure (e.g., method 1 or method 2) and a constant gain closed loop circuits (e.g., method 3) can be designed for RF amplifiers.

Figure 3:
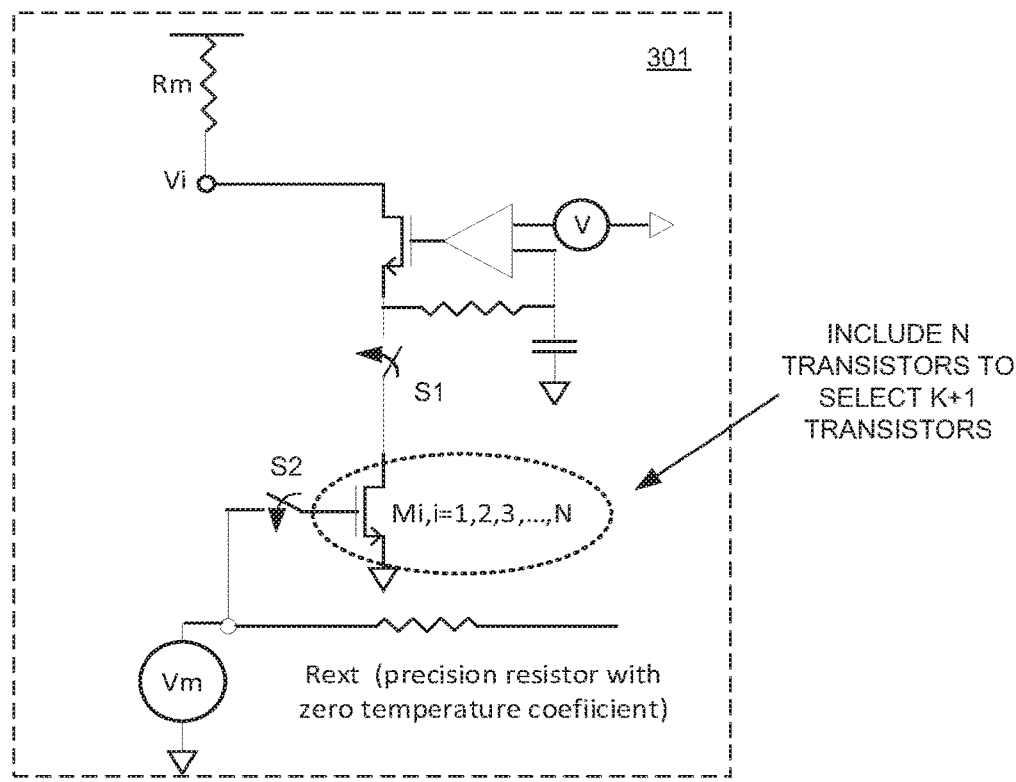
FIG. 3 illustrates a first method using a calibration circuit that providing accurate transistor size ratio for a bias generator.

FIG. 3 illustrates a first method using a calibration circuit 301 that provides accurate transistor size ratio K for a bias generator. In the embodiment of FIG. 3, a calibration circuit 301 is used to select (K+1) identical transistors from N transistors in RFIC, where N>(K+1). Each RFIC includes N identical transistors having size of (W/L), and each transistor is tested using the calibration circuit 301. The testing and selection steps are as follows. Step 1) For a gate voltage Vm, cycle through each of the N transistors and measure a drain current, i.e., from the voltage drop across a precision resistor Rm. Step 2) For each transistor, obtain multiple points in its I-V curve by varying Vm and measuring corresponding drain current. Step 3) From I-V curves of N transistors, obtain the same operating point for all transistors close to the desired Gm in the I-V curves. Step 4) Select (K+1) transistors with closely matching Gm in the I-V curves. Step 5) Select one and K transistors with best matching radio K which is used as M1 and M2 in the constant Gm bias generator 201 in FIG. 2. In one example, select (K+1) transistors from N transistors involves minimizing the value of $ABS[V_j*N-\Sigma_{i=1}^{N}(V_i)]$, where Vj is the detected drain voltage of the j-th selected transistor, to select the best matching of K transistors and 1-to-K transistor size ratio. Note that switches S1 and S2 are used to switch each of the N transistors to be connected to the calibration circuit for measurement and calibration, or to be connected to the bias generator after being selected, e.g., under the control of a calibration engine of the bias generator.

Figure 4:
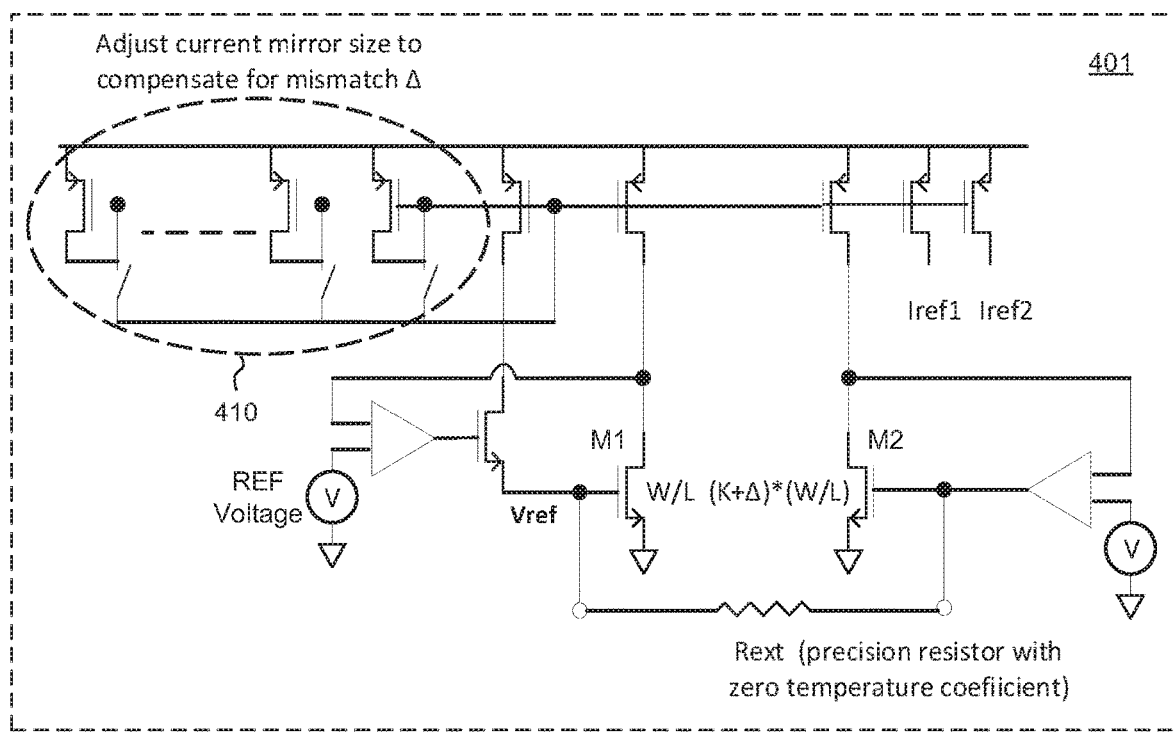
FIG. 4 illustrates improvement of the first method on inaccuracy due to calibration error in the transistor size.

FIG. 4 illustrates improvement of the first method on inaccuracy due to calibration error in the transistor size for bias generator 401. Under the first method, there may be inaccuracy in 1) the transistor size ratio K, say Δ, after selecting the (K+1) transistors out of the N transistors, or 2) the error, ε, in the threshold voltage $V_{th}$ of transistors. For example, the calibrated transistor size for M2 may be (K+Δ)*(W/L). If so, further refinement can be obtained by adjusting the transistor size of current mirror to correct error induced by Δ in the size ratio K. Both Δ and ε can be obtained from I-V measurements. In FIG. 4, circuit 410 comprising a plurality of small transistors and switches can be used in the constant Gm bias generator 401 to adjust the current mirror size to compensate for mismatch Δ.

Figure 5:
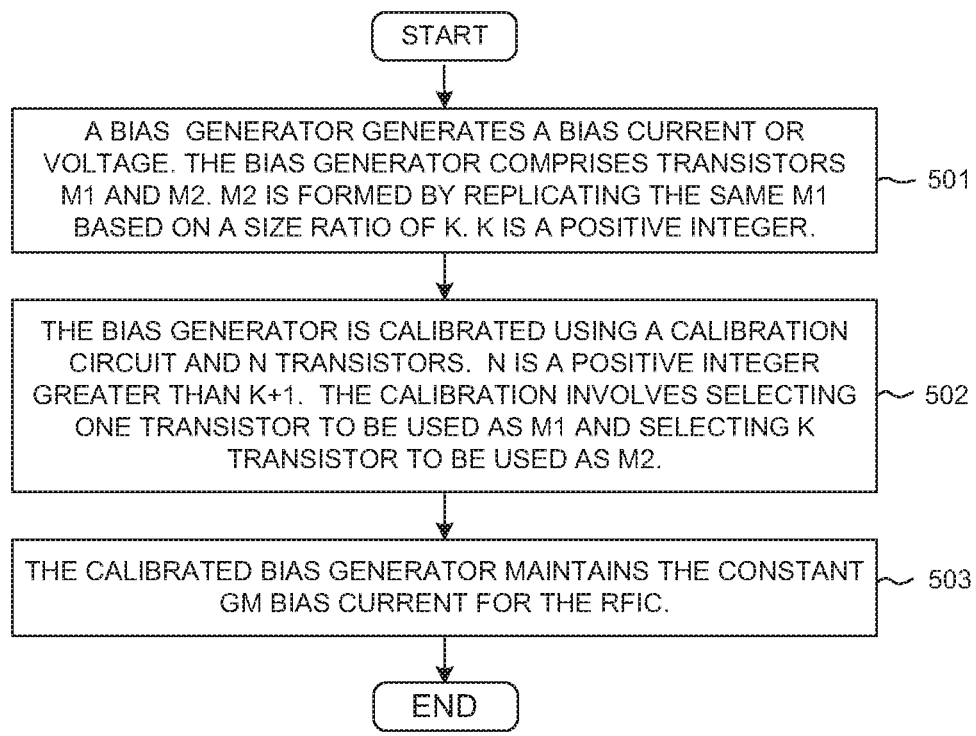
FIG. 5 is a flow chart of a first method of maintaining a constant transconductance (Gm) bias for a radio frequency integrated circuit (RFIC) in accordance with a novel aspect.

FIG. 5 is a flow chart of a first method of maintaining a constant transconductance (Gm) bias for a radio frequency integrated circuit (RFIC) in accordance with a novel aspect. In step 501, a bias generator generates a bias current or voltage. The bias generator comprises a first transistor (M1) and a second transistor (M2). M2 is formed by replicating the same M1 based on a size ratio of K, and K is a positive integer. In step 502, the bias generator is calibrated using a calibration circuit and N transistors in the RFIC. N is a positive integer that is greater than (K+1), and the calibration involves selecting one transistor to be used as M1 and selecting K transistors to be used as M2. In step 503, the calibrated bias generator maintains the constant Gm bias for the RFIC.

Figure 6:
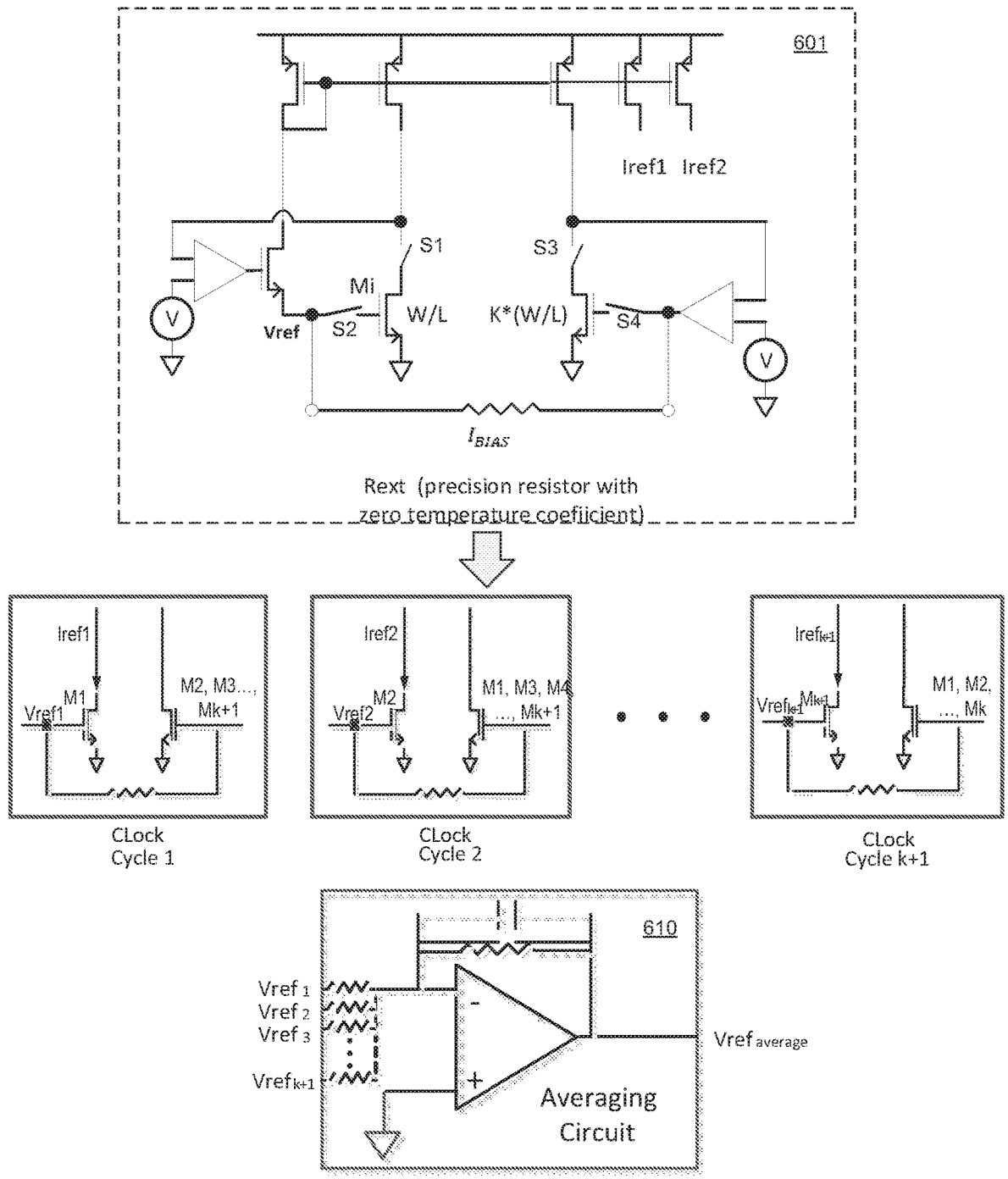
FIG. 6 illustrates a second method using time domain averaging during operation to provide constant Gm for a bias generator.

FIG. 6 illustrates a second method using time domain averaging during operation to provide constant Gm for a bias generator 601. The bias generator 601 comprises (K+1) transistors that can be placed on the left or the right side of the bias generator. Under the second method, a precision clock and be used to select in a round robin fashion—for each clock cycle (e.g., 1 msec), one of the (K+1) transistors ($M_i$) is selected to be on the left side of the bias generator 601, and the remaining K transistors are selected to be on the right side of the bias generator 601. For example, at clock cycle 1, $M_1$ is at the left side, at clock cycle 2, $M_2$ is at the left side, . . . , at clock cycle K+1, $M_{K+1}$ is at the left side. An averaging circuit 610 is then used to average the gate voltage ($Vref_i$) over (K+1) clock cycles. $Vref_{average}$ is the average result reference voltage of the constant Gm biasing. Note that switches S1-S4 are used to place each of the (K+1) transistors to be on the left or the right side of the bias generator, e.g., under the control of a calibration engine of the bias generator. This second method may create switching noise due to the time domain averaging.

Figure 7:
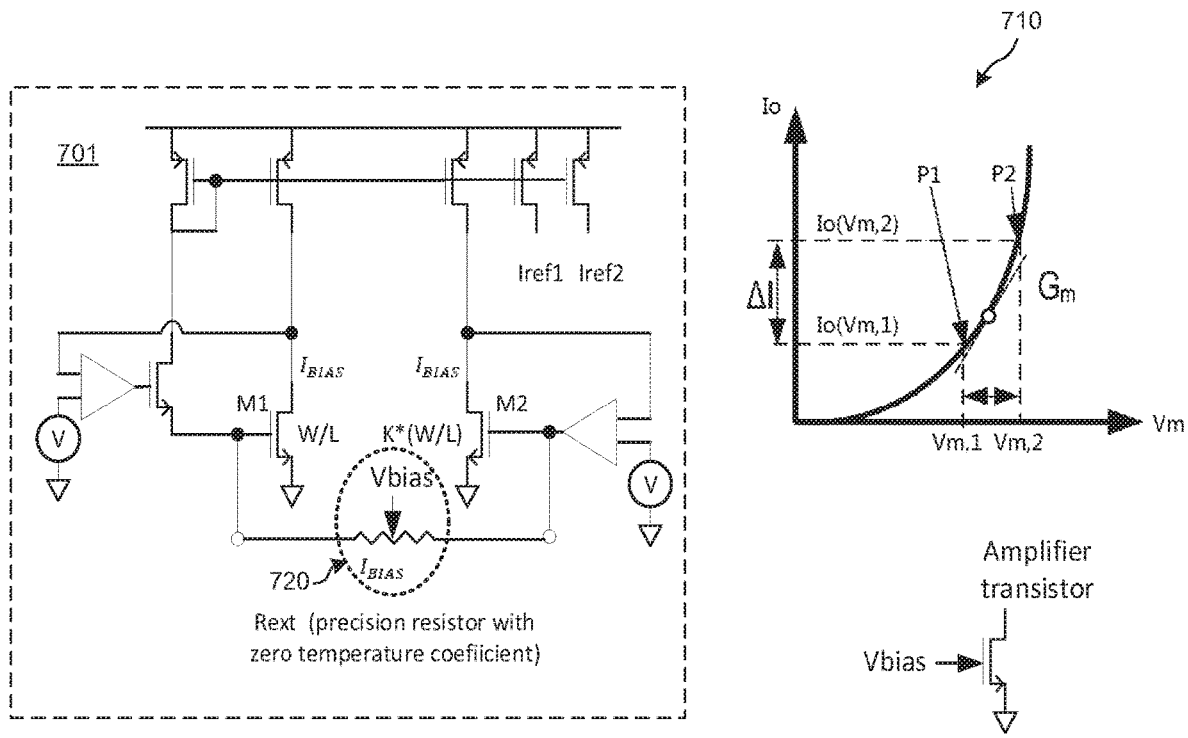
FIG. 7 illustrates improvement of a constant Gm bias generator by reducing interpolation error of the Gm due to nonlinearity on the I-V curve.

FIG. 7 illustrates improvement of a constant Gm bias generator by reducing interpolation error of the Gm due to nonlinearity on the I-V curve. As depicted by I-V curve 710 of an amplifier transistor, the operating point for desired Gm value lies between Point P1 and Point P2. Under method 1 and method 2 illustrated above, assume the same operating point (same Vm and Io) for all transistors, and select (K+1) transistors with the best matching ratio or time-domain averaging. Transistor M1 size (W/L) is equal to the size of the amplifier transistor, and transistor M2 size is K*(W/L). Hence, constant Gm circuit obtains an approximation of Gm based on the different M1 and M2 transistor sizes—resulting in an interpolation error. In accordance with one novel aspect, a Vbias voltage is used inject at a certain tap in resistor Rext to create an offset gate voltage between the two transistors M1 and M2, to compensate for the nonlinearity in the I-V curve due to different bias voltage points. In the example of FIG. 7, the Vbias is used to convert resistor Rext into two serial connected resistors, the ratio of the two serial connected resistors has an optimal value to compensate for the non-linearity of the I-V curve of the amplifier transistor.

Figure 8:
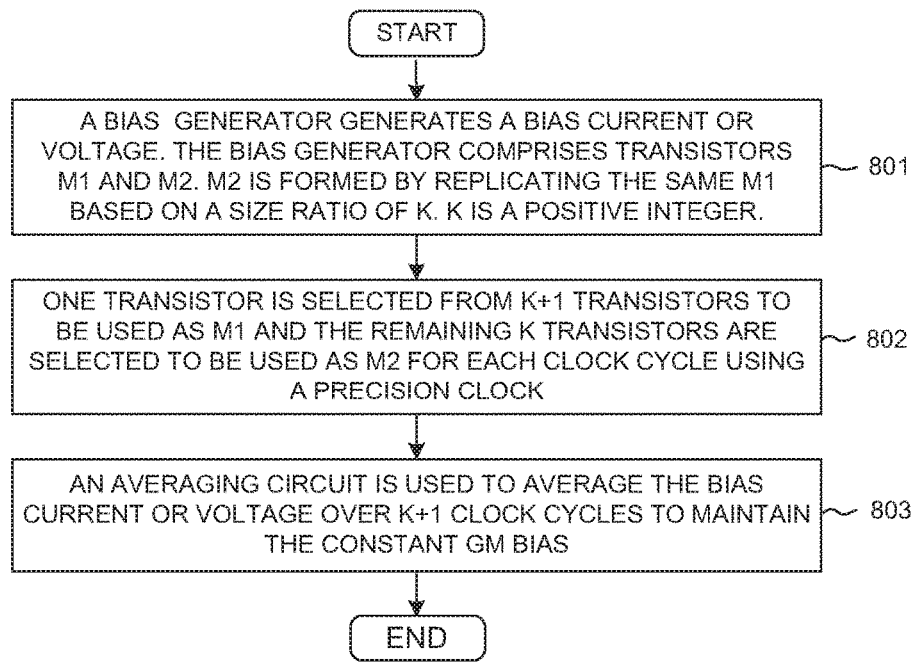
FIG. 8 is a flow chart of a second method maintaining a constant transconductance (Gm) bias for a radio frequency integrated circuit (RFIC) in accordance with one novel aspect.

FIG. 8 is a flow chart of a second method maintaining a constant transconductance (Gm) bias for a radio frequency integrated circuit (RFIC) in accordance with one novel aspect. In step 801, a bias generator generates a bias current or voltage. The bias generator comprises a first transistor (M1) and a second transistor (M2), and M2 is formed by replicating the same M1 based on a size ratio of K, and K is a positive integer. In step 802, one transistor from the (K+1) transistors is selected to be used as M1 and the remaining K transistors are selected to be used as M2 for each clock cycle using a precision clock. In step 803, an averaging circuit is used to average the bias current or voltage of the bias generator over (K+1) clock cycles to maintain the constant Gm bias.

Figure 9:
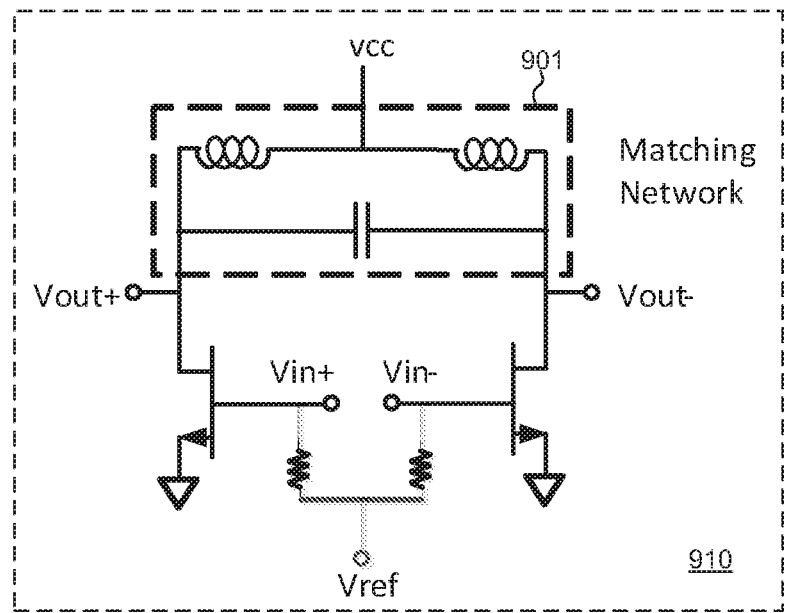
FIG. 9 illustrates a third method of providing constant Gm*$R_{equivalent}$ or constant gain for RF amplifiers in accordance with one novel aspect.

FIG. 9 illustrates a third method of providing constant Gm*$R_{equivalent}$ or constant gain for RF amplifiers in accordance with one novel aspect. RF amplifiers are connected to a matching network. It is noted that an RF amplifier gain is determined by Gm*the parallel connection of the impedance of the matching network and the output impedance of two transistors in the RF amplifier. FIG. 9 depicts a matching network 901 that is part of an RF amplifier 910, and Vref is provided by a constant gain bias generator. At the center frequency of the amplifier frequency response, the reactive elements of the matching network cancel each other, leaving an equivalent load resistor Rz in the matching network. As a result, an equivalent resistor $R_{equivalent}$=equivalent load resistance in matching network (Rz)//transistor output Rout//other R (such as from the input to the next stage). For the sake of simplicity, we assume the other R is zero, although in real implementation, it should be accounted for in similar way as Rout and Rz. The amplifier gain at the center frequency of the amplifier frequency response is thus Gm*$R_{equivalent}$. As compared to control Gm of the RF amplifier, in one novel aspect, it is more precise to control Gm*$R_{equivalent}$ for the RF amplifier.

Figure 10:
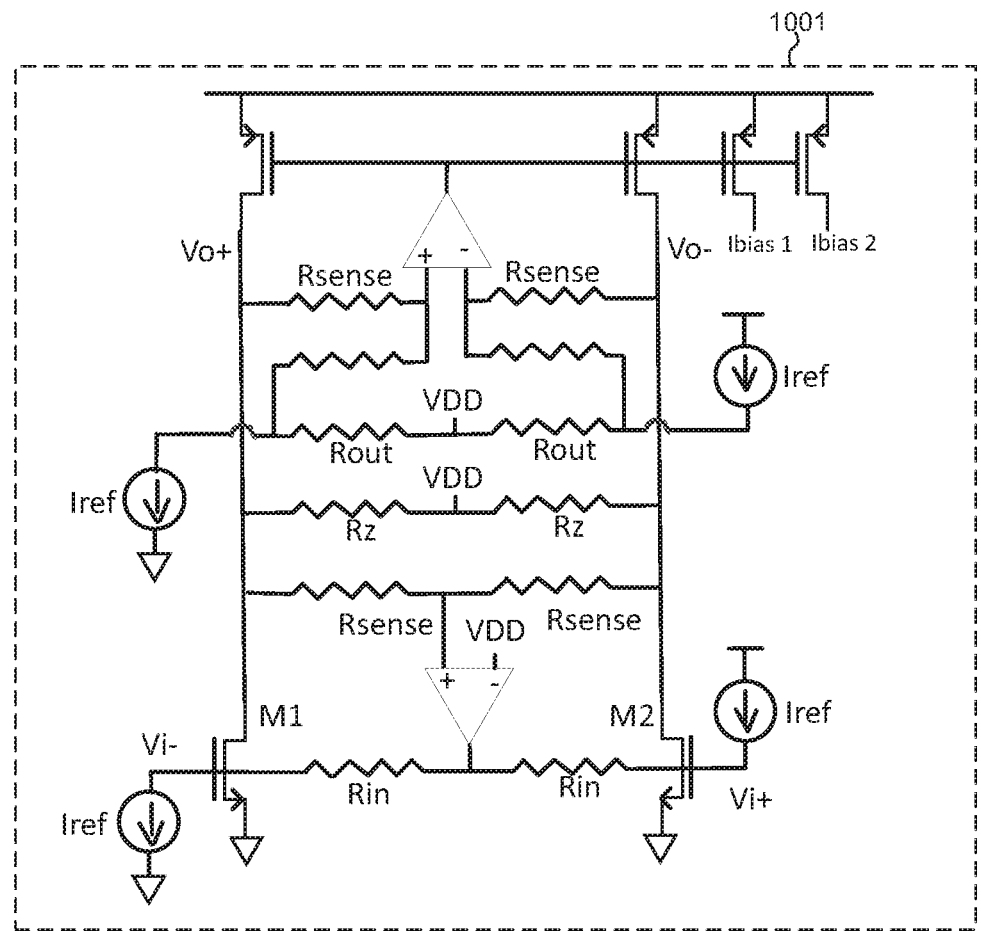
FIG. 10 illustrates is a simplified circuit diagram of a bias generator supporting constant gm*R or constant gain under the third method.

FIG. 10 illustrates a simplified block diagram of a constant gain bias generator 1001 under the third method. In one example, the constant gain bias generator 1001 provides constant gain for RF amplifier 910, it tries to adjust the bias current and the corresponding gate voltage until the amplifier gain is equal to a preset value while maintaining the drain voltage. The bias generator 1001 should employ a drain load which is identical to the drain load of the RF amplifier 910, e.g., the real part resistor (Rz) of the L-C matching network 901 in FIG. 9. The RF amplifier gain is determined by the drain load which consists of the output impedance Zout of the amplifier transistor, and the impedance of the output matching network. Ideally, the imaginary part of the drain load (consisting of output matching network impedance and transistor output impedance) should be equal to zero at the RF amplifier tuned frequency, and only the real part (i.e., Rz) of the matching network and the real part (i.e., Rout) of the transistor output impedance is visible to the RF transistor.

Two error amplifiers with closed loop feedback are used: 1) The top one is to generate the desired differential mode drain voltage difference (differential gain); and 2) the bottom one is to generate the proper common mode drain voltage. The bottom common mode feedback loop adjusts the common mode gate bias voltage (i.e., the common mode of Vi+, Vi−) to force the common mode voltage of the output nodes Vo+, Vo− to equal to VDD. The top differential mode feedback loop will adjust the bias current until the differential output voltage (Vo+, Vo−) is equal to 2*Iref*Rout. The time constant of the top differential loop should be 10 times slower than the time constant of the bottom loop for stability.

The differential input (Vi+,Vi−) is equal to the voltage 2*Iref*Rin. The top difference error amplifier compares (Vo+, Vo−) with 2*Iref*Rout and forces them to be equal by adjusting the PMOS current. In equilibrium, the differential transistor pair M1 and M2 have differential gain equal to: (Vo+−Vo−)/(Vi+−Vi−)=(2*Iref*Rout)/(2*Iref*Rin)=Rout/Rin. The same bias current from M1 and M2 is fed to RF differential amplifier, having same transistor size and thus same Zo as M1 and M2, to provide the same RF gain with identical drain load with Rz equal to the real part of the output matching network. Note that the bias current from M1 and M2 will maintain the RF gain to be constant.

The amplifier gain is only defined by the ratio of Rout vs Rin. The resistor ratio is insensitive to wafer process, supply voltage and temperature. To reduce the amplifier tracking error in the closed loop operation, it is desirable to use larger differential voltage (Vi+, Vi−) but avoiding too large a differential voltage such that the large signal distortion on the (Vo+, Vo−) starts to affect the operation. Absolute value and temperature coefficient of Iref, Rin, and Rout does not impact the accuracy of the constant gain bias, only the ratio of Rout vs. Rin affects the amplifier gain. This bias provides very accurate gain tracking performance and requires no precision component, just matching of Rout vs Rin.

Rz (equal to the real part of the amplifier output matching network) typically has very little variations among process, supply voltage, and temperature. Additionally, Rz can be significantly larger than Rout, thus, contributing less to Requivalent. Therefore, if an external precision resistor is used for the constant gain bias generator, then it can be expected that the corresponding RF amplifier gain varies little over process variations, supply voltage, and temperature variations. Rz can be implemented with the precision external resistor or alternatively an on-chip poly resistor and can be trimmed during wafer calibration to compensate for poly sheet resistance variation and matching network variation. Optimal Rz trimming setting for a particular lot can be calculated or simulated using wafer test data, such as metal sheet resistance (imply metal thickness), poly sheet resistance, measured capacitance deviation and measured inductance deviation.

Under the fourth method, the constant Gm calibration procedure and the constant gain closed loop circuit can be combined, e.g., by adding more switches to merge the constant Gm calibration circuit and the constant gain circuit. The fourth implementation is a combination of first using transistor selection method such as method 1 to select (K+1) transistor with good consistent matching property among a population of N transistors, and then use method 3 to maintain the constant gain for the RF amplifier. The selection method can be extended to other devices such as Rz and Rout used in the bias generator as well to increase precision.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method for maintaining a constant transconductance (Gm) bias for a radio frequency integrated circuit (RFIC), comprising:
    generating a bias current or a bias voltage from a bias generator comprising a first transistor (M1) and a second transistor (M2), wherein M2 is formed by replicating the same M1 based on a size ratio of K, wherein K is a positive integer;
    calibrating the bias generator using a calibration circuit and N transistors in the RFIC, wherein N is a positive integer that is greater than (K+1), wherein the calibration involves selecting one transistor to be used as M1 and selecting K transistors to be used as M2; and
    maintaining the constant Gm bias for the RFIC using the calibrated bias generator.

2. The method of claim 1, wherein the transconductance Gm is determined by the size ratio K between transistor M1 and transistor M2.

3. The method of claim 1, wherein the calibration circuit obtains an I-V curve for each of the N transistors by measuring a drain current for a gate voltage of a corresponding transistor.

4. The method of claim 3, wherein the calibration circuit obtains the same operating point for transistors close to a desired Gm in the corresponding I-V curves.

5. The method of claim 3, wherein the calibration circuit selects the (K+1) transistors from the N transistors with the best matching ratio K based on the I-V curves.

6. The method of claim 3, wherein the N transistors are coupled to the calibration circuit or to the bias generator via a plurality of switches controlled by a calibration engine.

7. The method of claim 1, wherein the bias generator further adjusts a current mirror to compensate for a matching error in the ratio K.

8. The method of claim 1, wherein an interpolation error of the Gm on the I-V curves is compensated by using two serial resistors with a voltage bias.

9. A method for maintaining a constant transconductance (Gm) bias for a radio frequency integrated circuit (RFIC), comprising:
generating a bias current or a bias voltage from a bias generator comprising a first transistor (M1) and a second transistor (M2), wherein M2 is formed by replicating the same M1 based on a size ratio of K, wherein K is a positive integer;
selecting one transistor from (K+1) transistors to be used as M1 and selecting the remaining K transistors to be used as M2 for each clock cycle using a precision clock; and
averaging the bias current or bias voltage of the bias generator over (K+1) clock cycles to maintain the constant Gm bias.

10. The method of claim 9, wherein the transconductance Gm is determined by the size ratio K between transistor M1 and transistor M2.

11. The method of claim 9, wherein M1 is selected from the (K+1) transistors for each clock cycle in a round robin fashion.

12. The method of claim 9, wherein each of the (K+1) transistors are coupled in the bias generator using a plurality of switches controlled by a calibration engine.

13. The method of claim 12, wherein the plurality of switches is turned on or off such that any one of the (K+1) transistors can be used as either M1 or M2.

14. The method of claim 9, wherein an interpolation error of the Gm on the I-V curves is compensated by using two serial resistors with a bias voltage.

15. A radio frequency integrated circuit (RFIC), comprising:
a radio frequency amplifier (RF amplifier) comprising transistors and an output matching network (OMN), wherein the RF amplifier has an equivalent drain load including an output load of the amplifier transistors and an output load of the OMN; and
a constant gain bias generator, comprising:
a differential transistor pair having the same output load as the output load of the amplifier transistors;
feedback loops that generate a proper drain voltage and a desired drain voltage differential gain; and
a resistor having a resistance that is equal to the output load of the OMN, wherein the constant gain bias generator maintains a bias current and a drain voltage such that the RF amplifier has a predefined RF amplifier gain.

16. The RFIC of claim 15, wherein the RF amplifier gain is determined by a transconductance Gm times the equivalent drain load.

17. The RFIC of claim 15, wherein the feedback loops comprise a first common mode feedback loop that adjusts a common mode gate bias voltage of the differential transistor pair.

18. The RFIC of claim 15, wherein the feedback loops comprise a second differential mode feedback loop that adjusts the bias current and the drain voltage of the differential transistor pair.

19. The RFIC of claim 15, wherein the differential transistor pair has a constant differential gain that is equal to the RF amplifier gain.

20. The RFIC of claim 19, wherein the RF amplifier gain is only defined by a ratio of two resistors in the constant gain bias generator.

* * * * *